(12) United States Patent
Ramakrishnan

(10) Patent No.: US 6,388,942 B1
(45) Date of Patent: May 14, 2002

(54) DEEP PIPE SYNCHRONOUS SRAM

(75) Inventor: Purushothaman Ramakrishnan, Bangalore (IN)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/672,397

(22) Filed: Sep. 28, 2000

(51) Int. Cl.$^7$ .................................................. G11C 8/00
(52) U.S. Cl. ............... 365/233; 365/230.08; 365/189.05
(58) Field of Search .............. 365/233, 230.08, 365/189.05

(56) References Cited

U.S. PATENT DOCUMENTS

| | | | | |
|---|---|---|---|---|
| 4,882,709 A | | 11/1989 | Wyland ................. | 365/189.02 |
| 5,241,510 A | * | 8/1993 | Kobayashi et al. .... | 365/230.03 |
| 5,404,553 A | * | 4/1995 | Komori et al. ......... | 395/800 |
| 5,787,489 A | * | 7/1998 | Pawlowski ............. | 711/169 |
| 5,828,606 A | | 10/1998 | Mick ...................... | 365/189.05 |
| 5,838,631 A | | 11/1998 | Mick ...................... | 365/233 |
| 5,841,732 A | | 11/1998 | Mick ...................... | 365/233 |
| 5,875,151 A | | 2/1999 | Mick ...................... | 365/233 |
| 6,014,339 A | * | 1/2000 | Kobayashi et al. ..... | 365/233 |
| 6,061,294 A | * | 5/2000 | Koshikawa ............. | 365/233 |
| 6,081,478 A | | 6/2000 | Mick et al. ............. | 365/233 |
| 6,094,399 A | | 7/2000 | Mick ...................... | 365/233 |
| 6,249,480 B1 | * | 6/2001 | Mick ...................... | 365/233 |

* cited by examiner

*Primary Examiner*—David Nelms
*Assistant Examiner*—Connie C. Yoha
(74) *Attorney, Agent, or Firm*—Christopher P. Maiorana, P.C.

(57) ABSTRACT

An apparatus configured to store and present data. The apparatus may comprise a plurality of storage elements configured to store one or more wordline signals. Each of the plurality of storage elements may be implemented within a memory cell.

20 Claims, 7 Drawing Sheets

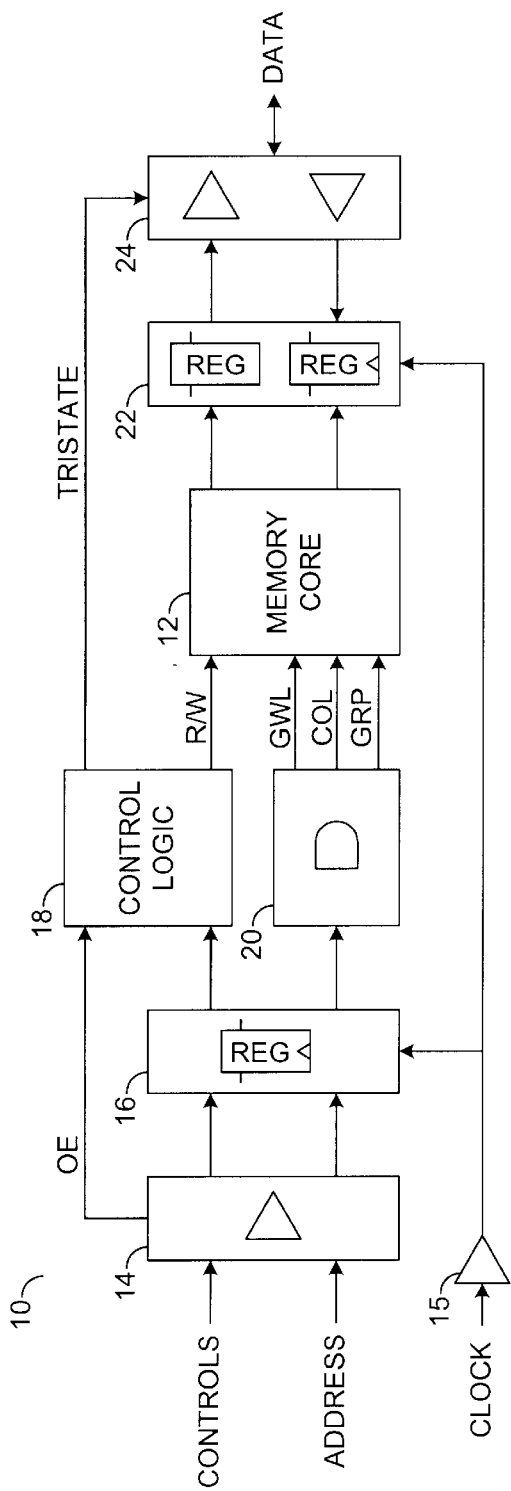
FIG. 1
(CONVENTIONAL)

DEEP PIPE SYNCHRONOUS SRAM

FIELD OF THE INVENTION

The present invention relates to a method and/or architecture for implementing a Static Random Access Memory (SRAM) generally and, more particularly, to a method and/or architecture for implementing a deep pipe synchronous SRAM.

BACKGROUND OF THE INVENTION

Referring to FIG. 1, a conventional pipelined synchronous SRAM 10 is shown. The memory 10 has a memory core 12, input buffers 14, a clock buffer 15, a register block 16, a control logic block 18, an address decoder 20, a register block 22 and input/output buffers 24. The memory core 12 can include one or more memory arrays, sense amplifiers, and write buffers (not shown). The address decoder 20 generates group GRP, column COL, and global wordline GWL control signals.

The input buffers 14 receive a number of control signals CONTROLS and a number of address signals ADDRESS. The register block 16 and the register block 22 receive a clock signal via the clock buffer 15. The control logic block 18 receives an output enable signal OE from the input buffers 14. The control logic block 18 presents a signal TRISTATE to the I/O buffer 24 and a signal R/W to the memory core 12. The address decoder block 20 presents the global wordline signal GWL, the column select signal COL and the group select signal GRP to the memory core 12. The memory core 12 presents and receives data through the register block 22 and the I/O buffers 24.

The memory 10 only implements pipeline registers (i.e., the register blocks 16 and 22) adjacent to primary inputs and primary outputs. It is not practical to introduce pipeline registers at certain internal nodes (i.e., locations other than primary inputs and outputs) of the synchronous SRAM 10 because of area overhead and layout constraints. For example, if the wordline signals (i.e., the global wordline signals GWL) are to be registered, the number of registers and, therefore, the area required is significant. In addition, the registers would have to be pitched with the memory cells, which can be difficult to achieve.

Additionally, the operating frequency of the memory 10 is determined by a time delay between an output from the register block 16 to an input of the register block 22 (i.e., the register to register delay). For the register to register delay of 't', the operating frequency is f=1/t. It would be desirable to implement a memory with additional pipeline stages to reduce the register to register delay and increase the operating frequency.

SUMMARY OF THE INVENTION

The present invention concerns an apparatus configured to store and present data. The apparatus may comprise a plurality of storage elements configured to store one or more wordline signals. Each of the plurality of storage elements may be implemented within a memory cell.

The objects, features and advantages of the present invention include providing a method and/or architecture for a deep pipe synchronous Static Random Access Memory (SRAM) that may (i) provide increased pipeline register stages, (ii) implement a modified version of a memory cell as a pipeline register stage and/or (iii) operate at a higher frequency than conventional SRAMs.

BRIEF DESCRIPTION OF THE DRAWINGS

These and other objects, features and advantages of the present invention will be apparent from the following detailed description and the appended claims and drawings in which:

FIG. 1 is a block diagram of a conventional pipeline synchronous SRAM;

DETAILED DESCRIPTION OF THE PREFERRED EMBODIMENTS

Figure 2:
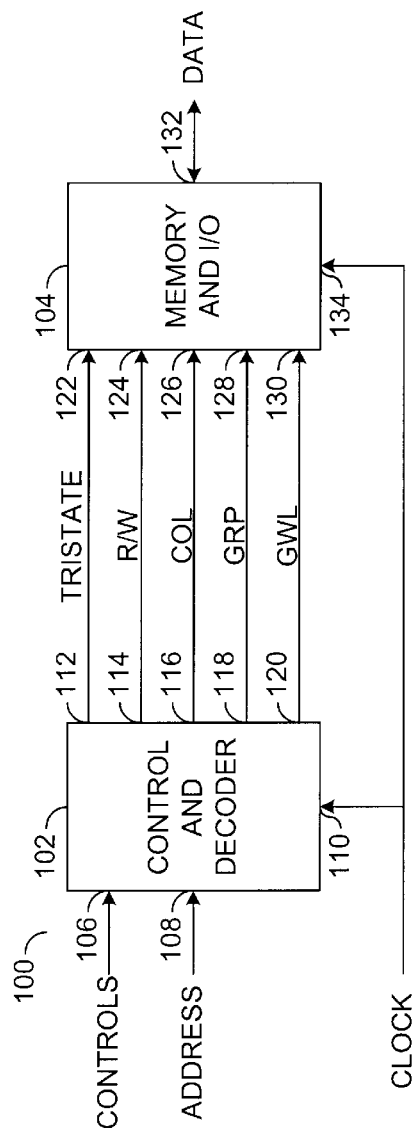
FIG. 2 is a block diagram of a preferred embodiment of the present invention.

Referring to FIG. 2, a block diagram of a memory system 100 is shown in accordance with a preferred embodiment of the present invention. The system 100 may provide an increased number of pipeline register stages. The system 100 may implement fast synchronous SRAMs by introducing more pipeline register stages. The system 100 may implement a modified version of a memory cell as a pipeline register stage. Additionally, the system 100 may operate at a higher frequency than conventional SRAMs.

The system 100 generally comprises a control and decoder block (or circuit) 102 and a memory and I/O block (or circuit) 104. The control and decoder circuit 102 may have an input 106 that may receive one or more control signals (e.g., CONTROLS), an input 108 that may receive one or more address signals (e.g., ADDRESS), an input 110 that may receive a clock signal (e.g., CLOCK), an output 112 that may present a signal (e.g., TRISTATE), an output 114 that may present a signal (e.g., R/W), an output 116 that may present a signal (e.g., COL), an output 118 that may present a signal (e.g., GRP), and an output 120 that may present a signal (e.g., GWL).

The signal TRISTATE may be presented to an input 122 of the memory and I/O circuit 104. The signal TRISTATE may be implemented as a tristate buffer control signal. The signal R/W may be presented to an input 124 of the memory and I/O circuit 104. The signal R/W may be implemented as a read/write control signal. The signal COL may be presented to an input 126 of the memory and I/O circuit 104. The signal COL may be implemented as one or more column select signals. The signal GRP may be presented to an input 128 of the memory and I/O circuit 104. The signal GRP may be implemented as one or more group select signals. The signal GWL may be presented to an input 130 of the memory and I/O circuit 104. The signal GWL may be implemented as one or more global wordline select signals. Additionally, the memory and I/O circuit 104 may have an input/output 132 that may present and/or receive data signals (e.g., DATA) and an input 134 that may receive the clock signal CLOCK. However, a particular signal type of the various signals of the circuit 100 may be varied in order to meet the criteria of a particular implementation.

Figure 3:
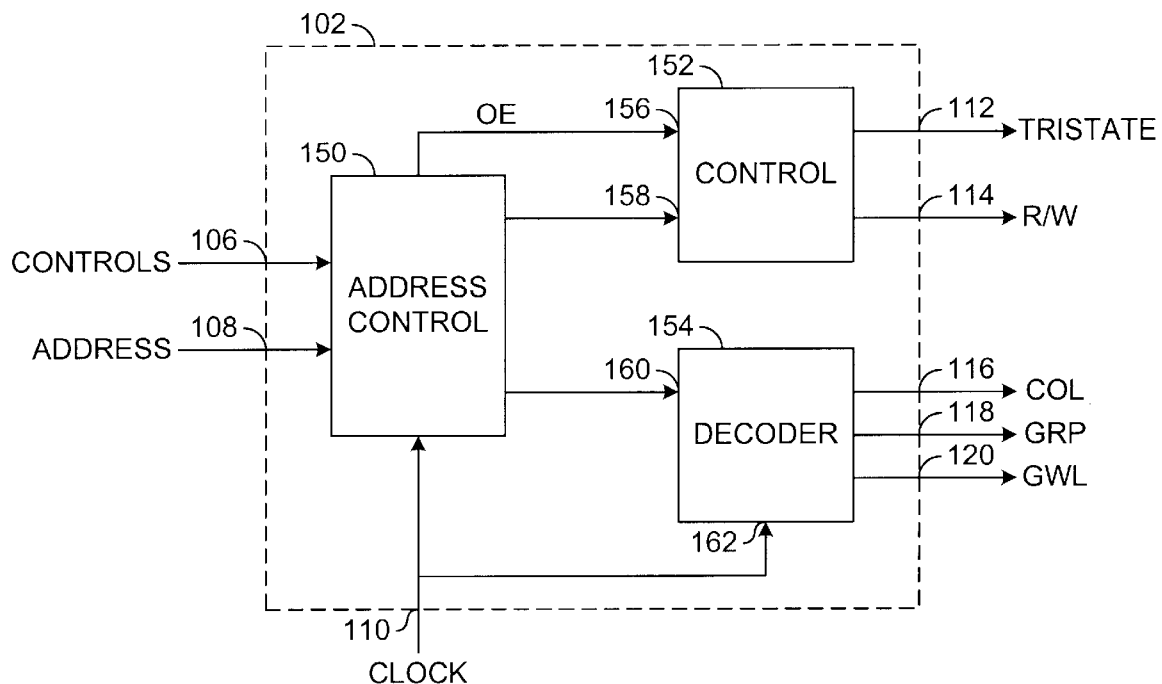
FIG. 3 is a detailed block diagram of the control and decoder circuit of FIG. 2.

Referring to FIG. 3, a more detailed diagram of the control and decoder circuit 102 is shown. The control and decoder circuit 102 generally comprises an address control block (or circuit) 150, a control block (or circuit) 152 and a decoder block (or circuit) 154. The address control circuit 150 generally receives the signals CONTROLS, ADDRESS and CLOCK. The signals CONTROLS may include, for example, an output enable signal (e.g., OE). The address control circuit 150 may buffer and present the signal OE to an input 156 of the control circuit 152. The address control circuit 150 may also present a first signal to an input 158 of the control circuit 152 and a second signal to an input 160 of the decoder circuit 154. The decoder circuit 154 may also have an input 162 that may receive the signal CLOCK. The control circuit 152 generally presents the signal TRISTATE and the signal R/W. The decoder circuit 154 generally presents the signal COL, the signal GRP, and the signal GWL. The circuits 152 and 154 may be configured to generate the respective signals presented in response to the respective signals received.

Figure 4:
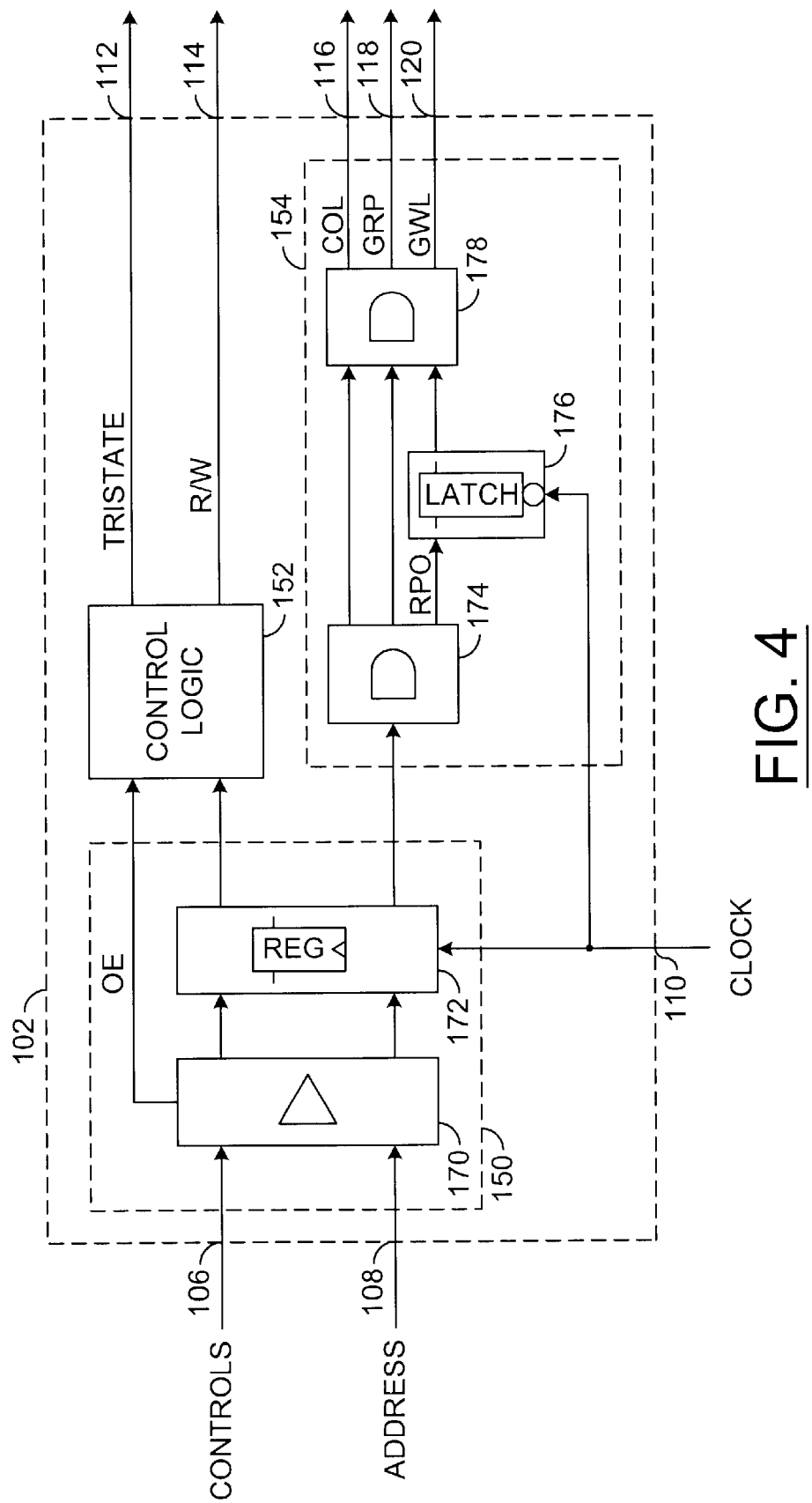
FIG. 4 is a more detailed block diagram of the control and decoder circuit of FIGS. 2 and 3.

Referring to FIG. 4, a more detailed diagram of the control and decoder circuit 102 is shown. The address control circuit 150 may comprise a block (or circuit) 170 and a block (or circuit) 172. In one example, the block 170 may be implemented as a number of input buffers and the block 172 may be implemented as an input register block. The input buffer 170 may receive the signals CONTROLS and ADDRESS. The input buffer 170 may also generate the output enable signal OE. The input buffer 170 may present a number of signals to the input register 172. The input register 172 may then present a first signal to the control logic block 152 and a second signal to the decoder 154.

The decoder circuit 154 generally comprises a block (or circuit) 174, a block (or circuit) 176 and a block (or circuit) 178. In one example, the block 174 may be implemented as a first stage of the decoder 154, the block 176 may be implemented as a latch, and the block 178 may be implemented as a second stage of the decoder 154. Alternatively, the block 174 may be implemented as a predecoder circuit and the block 178 may be implemented as a post decoder circuit. The latch 176 may be implemented as an active low latch. An active low latch is generally transparent (e.g., the output tracks the input) when the clock control input is low. The latch 176 may be clocked by the clock signal CLOCK. The first stage decoder 174 may receive the signal from the input register 172. The first stage decoder 174 may then present a number of signals to the second stage decoder 178 and a signal (e.g., RPO) to the latch 176. The signal RPO may be, for example, a row predecoder output. The latch 176 may present a signal to an input of the second stage decoder 178. The second stage decoder 178 may be configured to generate the control signals COL, GRP and GWL in response to the signals received from the block 174 and the latch 176.

Figure 5:
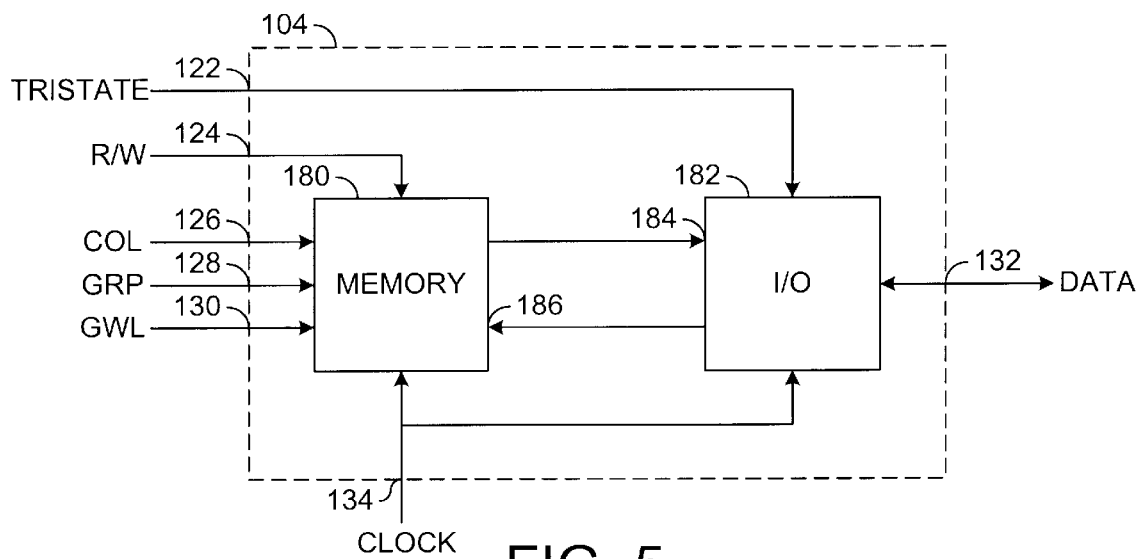
FIG. 5 is a detailed block diagram of the memory and input/output circuit of FIG. 2.

Referring to FIG. 5, a detailed diagram of the memory and I/O circuit 104 is shown. The memory and I/O circuit 104 generally comprises a memory block (or circuit) 180 and an I/O block (or circuit) 182. The memory 180 generally receives the signals R/W, COL, GRP, GWL and CLOCK. Additionally, the memory 180 may present a signal to an input 184 of the I/O block 182. The I/O block 182 may receive the signal TRISTATE, receive the signal CLOCK and present/receive the signal DATA. Additionally, the I/O block 182 may also present a signal to an input 186 of the memory 180.

Figure 6:
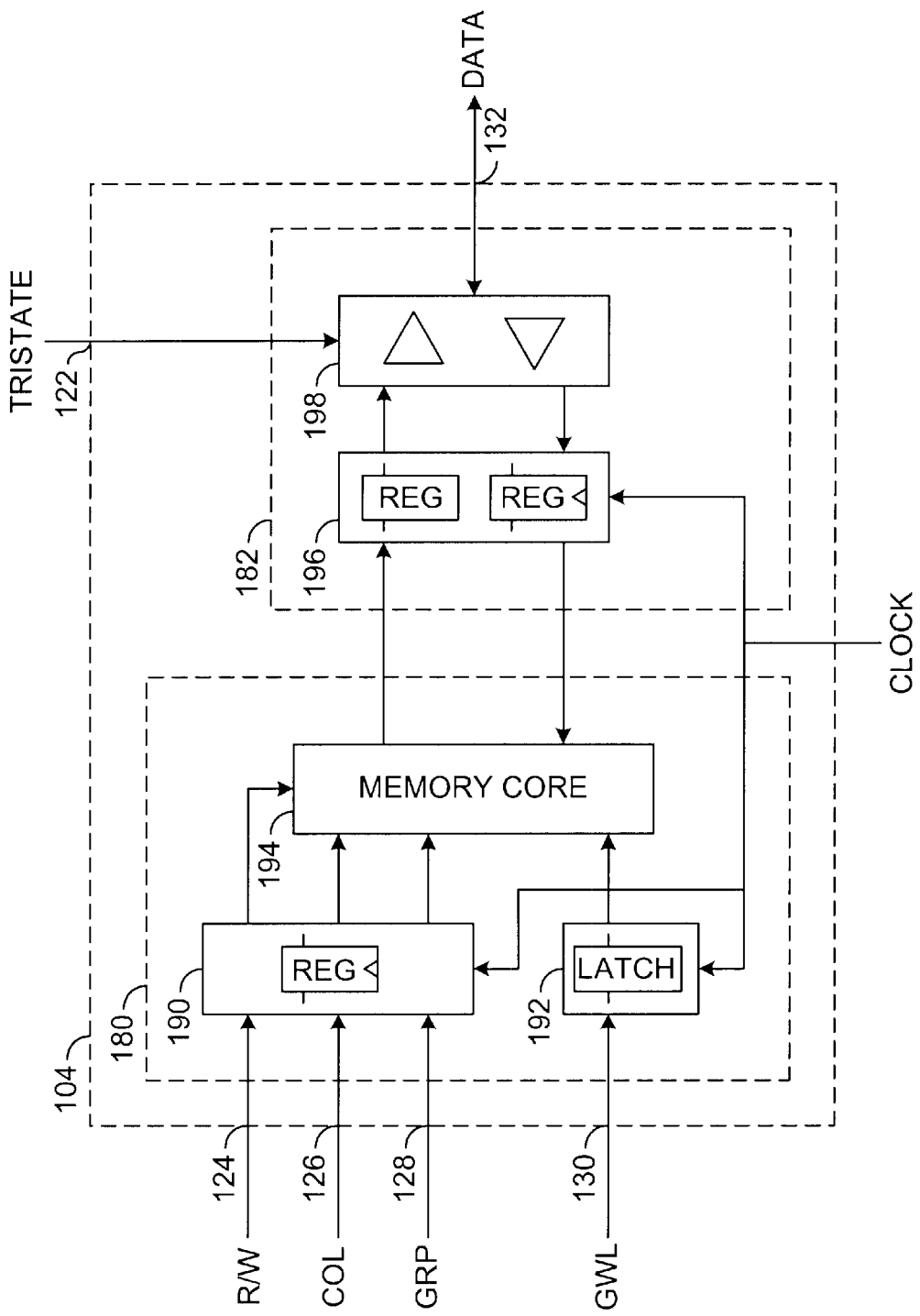
FIG. 6 is a more detailed block diagram of the memory and input/output circuit of FIGS. 2 and 5.

Referring to FIG. 6, a more detailed diagram of the memory and I/O circuit 104 is shown. The memory 180 may comprise a block (or circuit) 190, a block (or circuit) 192 and a memory block (or circuit) 194. The block 190 may be implemented as a register block. The block 192 may be implemented as a number of memory latches. The memory block 194 may be implemented, for example, as a static random access memory (SRAM) core. The memory latch 192 may be implemented as an active high latch. The register 190 and the memory latch 192 may be clocked by the clock signal CLOCK.

The memory core 194 generally comprises one or more memory arrays, sense amplifiers, write buffers, etc. (not shown). The register 190 may receive the signal R/W, the column select signal COL, and the group select signal GRP. The register 190 may present a number of signals to the memory core 194. The register 190 and the memory latches 192 may be clocked by the clock signal CLOCK.

Although the memory latches 192 are shown as a separate entity, the memory latches 192 may be implemented as a part of a memory array of the memory core 194. For example, a column of memory cells at an edge (or any other appropriate location) of a memory array of the memory core 194 may be used to form the memory latches 192 (to be discussed in connection with FIGS. 7 and 8).

The I/O circuit 182 may comprise a block (or circuit) 196 and a block (or circuit) 198. In one example, the block 196 may be implemented as a pipeline register block and the block 198 may be implemented as a number of I/O buffers. The register 196 may receive a signal from the memory core 194 and present a signal to the memory core 194. Additionally, the register 196 may receive the clock signal CLOCK. The register 196 may also present/receive signals to/from the I/O buffer 198. The I/O buffer 198 may be controlled by the signal TRISTATE. Additionally, the I/O buffer may present/receive the signal DATA.

Figure 7:
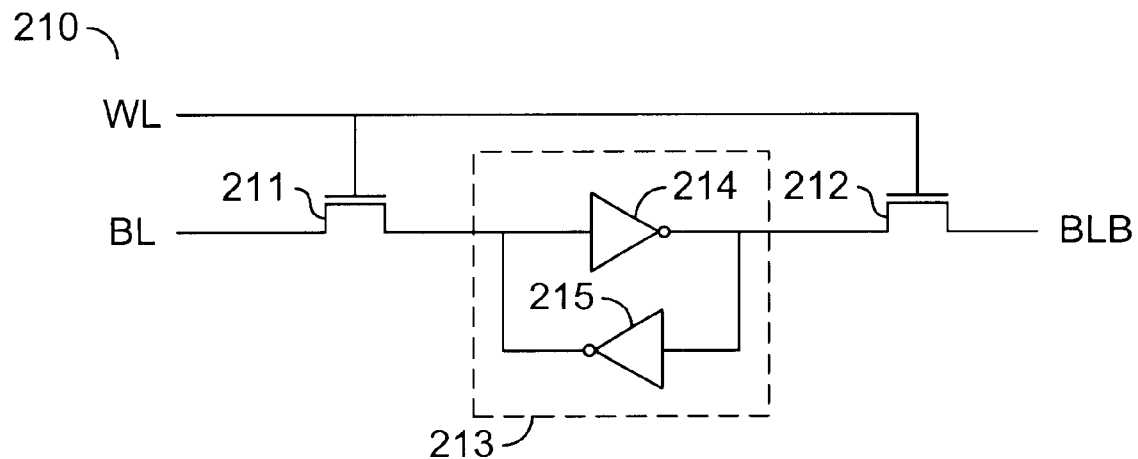
FIG. 7 is detailed block diagram of a memory cell in accordance with the present invention.

Referring to FIG. 7, a detailed diagram of a memory cell 210 is shown. The memory cell 210 may be implemented as a cell of the memory core 194. The memory cell 210 generally comprises a device 211, a device 212 and a block (or circuit) 213. In one example, the devices 211 and 212 may be implemented as one or more NMOS transistors. However, other types and polarities of transistors, for example, PMOS transistors, may be implemented to meet the design criteria of a particular application. The block 213 may be implemented as a latch. The latch 213 generally comprises an inverter 214 and an inverter 215. An output of the inverter 214 may be connected to an input of the inverter 215. An output of the inverter 215 may be connected to an input of the inverter 214. The memory cell 210 may receive a signal (e.g., BL), a signal (e.g., BLB) and a signal (e.g., WL). The transistors 211 and 212 may be gated by the signal WL. The transistor 211 may couple the signal BL to an input of the inverter 214. The transistor 212 may couple the signal BLB to an input of the inverter 215.

Figure 8:
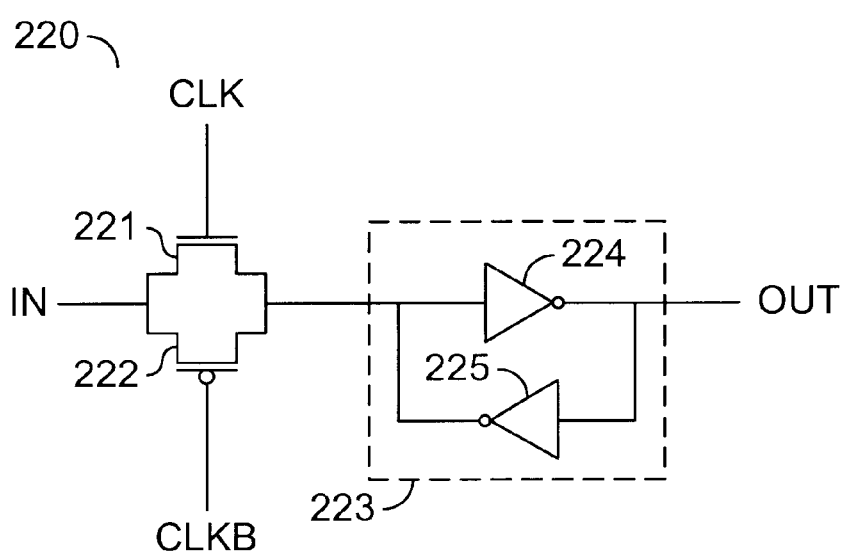
FIG. 8 is detailed block diagram of a memory latch in accordance with the present invention.

Referring to FIG. 8, a detailed diagram of a memory latch 220 is shown. The memory latch 220 may be implemented as a latch of the memory latch 192. The memory latch 220 generally comprises a device 221, a device 222 and a block (or circuit) 223. In one example, the device 221 may be implemented as an NMOS transistor. The device 222 may be implemented as a PMOS transistor. However, other types and polarities of transistors may be implemented accordingly to meet the design criteria of a particular application. The block 223 may be implemented as a latch. The latch 223 generally comprises an inverter 224 and an inverter 225. An input of the inverter 224 may be connected to an output of the inverter 225. An output of the inverter 224 may be connected to the input of the inverter 225. The memory latch 220 may receive a signal (e.g., IN), a signal (e.g., CLK) and a complement of the signal CLK (e.g., CLKB). Additionally, the memory latch 220 may present a signal (e.g., OUT). The transistor 221 may be gated by the signal CLK. The transistor 222 may be gated by the signal CLKB. The transistors 221 and 222 may be configured as a CMOS passgate. The transistors 221 and 222 may couple the signal IN to an input of the inverter 224.

The memory latch 220 may be implemented, in one example, from the memory cell 210 by removing the NMOS transistor 212 and adding a PMOS transistor in parallel with the transistor 211 to form a CMOS pass gate. Additionally, the invertor 224 in the memory latch 220 may be sized larger than the inverter 214 of the memory cell 210 such that the inverter 224 may drive a reasonable load.

Figure 9:
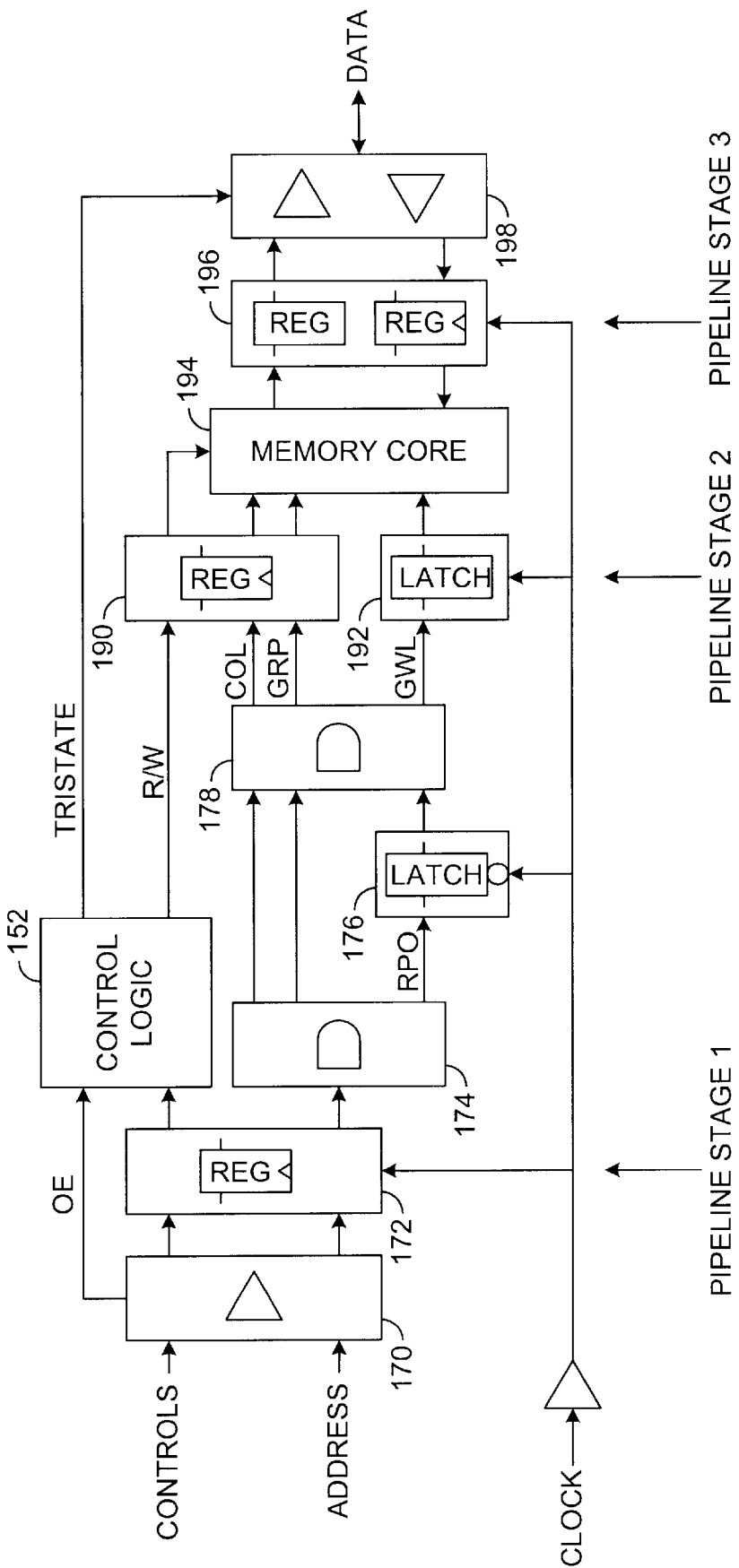
FIG. 9 is a detailed overview of the present invention.

Referring to FIG. 9, a detailed overview of the circuit 100 is shown. The circuit 100 may implement an increased number of pipeline stages. In one example, the circuit 100 may implement 3 pipeline stages (e.g., stage 1=the register block 172, stage 2=the register block 190 and the latches 176 and 192, and stage 3=the register block 196) to allow an increased operating frequency. Conventional memory devices only implement pipeline registers adjacent to the primary inputs and outputs. In a preferred embodiment of the present invention, the circuit 100 may implement an additional pipeline stage at an output of the post-decoder 178 to register the global wordline signals GWL, the column select signals COL, and the group select signals GRP. The signals COL and GRP may be registered using a conventional register. The latches 176 and 192 may form a register (e.g., a master and a slave portion, respectively) for registering the signal GWL.

In one embodiment, standard registers may be avoided to register the global wordline signal GWL to minimize area impact. The circuit 100 may implement two latches (e.g., the latch 176 and the memory latch 192) to register the global wordline signal GWL. The circuit 100 may implement a first latch at an output of a first stage of a row decoder and a second latch at an output of a second stage of a row decoder to form a register. The two latches may be implemented to function together as a register.

Since a particular number of latches required for latching an output of a row predecoder may not be high (e.g., 32 latches for 8 to 256 row decoding), typical latches may be implemented. However, since a particular number of latches required for latching wordline signals may be high (e.g., 256 latches for 8 to 256 row decoding), the present invention may implement a modified version of a memory cell (e.g., the memory latch 220 described in connection with FIG. 8) as the wordline latches. However, another appropriate type of storage element may be implemented to meet the design criteria of a particular application.

By introducing a pipeline register stage (e.g., the register 190 and the latches 176 and 192) at an intermediate stage, the register to register delay of the circuit 100 may be reduced by half. Hence, the operating frequency of the circuit 100 may be double that of a conventional memory. Additional pipeline stages may be added to get additional speed increases. In a preferred embodiment, the circuit 100 may be implemented with an additional pair of latches (e.g., a single additional pipeline register stage). However, the circuit 100 may be implemented with any other number of register stages (pairs of latches) needed to meet the design criteria of a particular application. An increased number of registers may further increase the operating frequency of the circuit 100.

For example, an additional pipeline stage generally requires an additional clock cycle to output data. However, the additional pipeline stage also doubles the operating frequency. Therefore, the total time required to output data may remain the same as for the conventional methods. However, when continuous reads are performed, the subsequent reads may be faster because the register to register delay is generally half that of the conventional methods. Thus, the present invention may provide a speed advantage for multiple reads while incurring no loss of performance for a single read.

The optimal number of pipeline stages may be determined by balancing the trade-off between area overhead and speed improvement. The conventional pipeline memory has only two pipeline stages, one adjacent to the primary inputs and a second adjacent to the primary outputs. In a preferred embodiment of the present invention, a pipeline stage is placed between the two conventional pipeline stages. When an additional pipeline stage is added, the location should generally be midway (from the perspective of the register to register delay) between the two existing pipeline stages. In one example, the additional pipeline stage may need to be added after the address decoders. However, the number of signals to be registered after the address decoders may be too great for conventional registers. Column select signals and group select signals may not be too many, but the row select signals (e.g., GWL) may number in the hundreds. The conventional approach of using normal registers will not work here because (i) the area overhead will be very high and (ii) the pipeline registers for the row select signals should be pitched with the memory cells which may be difficult to achieve. The use of a modified version of a memory cell may allow the additional pipeline register to be pitched with the memory cells of the memory core 194. In a preferred embodiment of the present invention, the problem of registering the row select signals may be solved by using a modified version of a memory cell as a latch. The master and slave stages of the additional pipeline register may be separated. For example, the slave stage of the register may be implemented in the memory array (e.g., the memory latch 192) and the master stage may be implemented using a normal latch (e.g., the latch 176). By separating the master and slave stages, the master stage may be placed midway (from the perspective of the register-to-register delay) between the slave stage and the previous pipeline stage.

Figure 10:
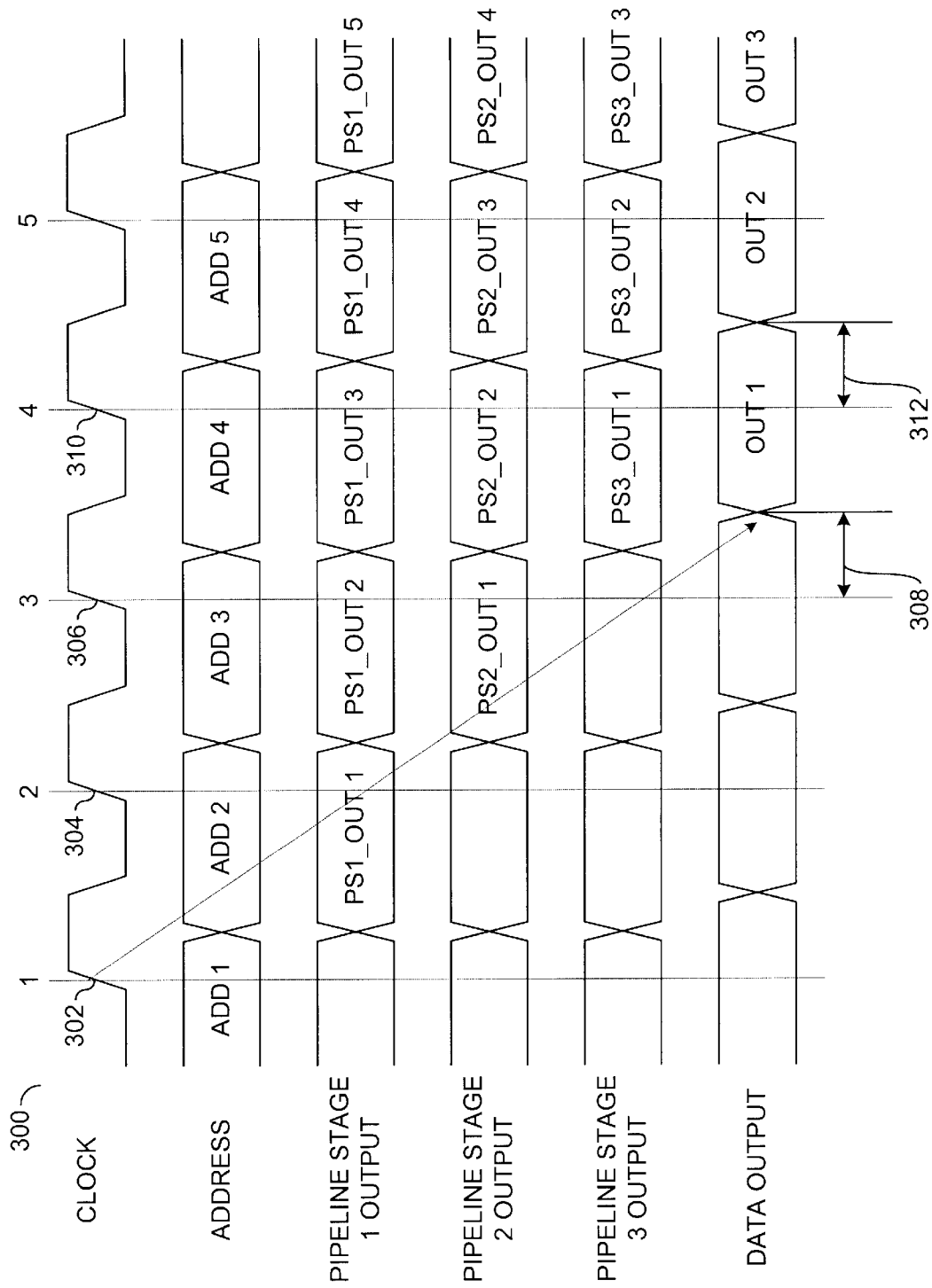
FIG. 10 is a timing diagram illustrating an example read operation in accordance with a preferred embodiment of the present invention.

Referring to FIG. 10, a timing diagram of switching waveforms 300 illustrating an example read operation of the circuit 100 is shown. At a clock edge 302, the value of the address inputs (e.g., ADD1) may be registered in the pipeline register of pipeline stage 1 (e.g., register 172 of FIG. 9). The output of the register may be, for example, PS1_OUT1. The signal PS1_OUT1 may be applied to the address decoder. The output of the address decoder may be registered by the pipeline register of pipeline stage 2 (e.g., register 190, latch 176 and memory latch 192) at the clock edge 304. The output of the pipeline stage 2 may present a signal (e.g., PS2_OUT1). The signal PS2_OUT1 may select an appropriate row, column and group in the memory array 194. The data read from the selected portion of the memory array 194 may be registered in the pipeline register of the pipeline stage 3 (e.g., register 196) at the clock edge 306. An output of the pipeline stage 3 may present a signal (e.g., PS3_OUT1). The signal PS3_OUT1 may be applied to the I/O buffers 198. The I/O buffers 198 may present the data as the signal OUT1 (DATA). When the address of the memory location to be read (e.g., ADD1) is applied to the circuit 100 at the clock edge 302, the data read from the memory (e.g., the signal OUT1) is generally available after the clock edge 306 (e.g., time interval 308). Similarly, when the address of the memory location to be read (e.g., ADD2) is applied to the circuit 100 at the clock edge 304, the data read from the memory (e.g., OUT2) is generally available after the clock edge 310 (e.g., time interval 312).

The circuit 100 may provide a pipelined synchronous SRAM with an increased number of pipeline register stages. The circuit 100 may implement a modified version of a memory cell as part of a pipeline register stage. With the increased number of pipeline register stages, the circuit 100 may operate at a higher frequency than a conventional SRAM.

While the invention has been particularly shown and described with reference to the preferred embodiments thereof, it will be understood by those skilled in the art that various changes in form and details may be made without departing from the spirit and scope of the invention.

What is claimed is:

1. An apparatus configured to store and present data, said apparatus comprising:
   a memory core comprising a plurality of memory cells arranged in columns and rows;
   a plurality of storage elements configured to store one or more wordline signals, wherein each of said plurality of storage elements is implemented within a column of said memory core.

2. The apparatus according to claim 1, wherein said apparatus comprises a pipelined synchronous Static Random Access Memory (SRAM).

3. The apparatus according to claim 1, wherein :
   memory cells in said column are configured to implement said plurality of storage elements.

4. The apparatus according to claim 1, wherein said storage elements comprise memory latches.

5. The apparatus according to claim 4, further comprising a second latch.

6. The apparatus according to claim 5, wherein said memory latches and said second latch comprise a register.

7. The apparatus according to claim 5, wherein said second latch is configured to latch one or more outputs of a row pre-decoder.

8. The apparatus according to claim 1, wherein said plurality of storage elements comprises a pipeline stage.

9. The apparatus according to claim 1, further comprising:
   a control and decoder circuit configured to generate one or more control signals; and
   a memory and input/output block configured to store and present data in response to said one or more control signals.

10. The apparatus according to claim 9, wherein at least one of said one or more control signals comprise column select signals.

11. The apparatus according to claim 9, wherein at least one of said one or more control signals comprise group select signals.

12. The apparatus according to claim 9, wherein at least one of said one or more control signals comprise global wordline signals.

13. The apparatus according to claim 1, wherein said plurality of storage elements are pitched with said memory cells.

14. An apparatus comprising:
   means for storing and presenting data comprising a plurality of memory cells arranged in columns and rows; and
   means for storing one or more wordline signals implemented within a column of said means for storing and presenting data.

15. A method for providing a deep pipe synchronous memory comprising the steps of:
   (A) storing a first value in a first stage of a pipeline in response to a clock signal;
   (B) storing one or more second values in one or more intermediate stages of said pipeline in response to said first value and said clock signal; and
   (C) storing a third value in a last stage of said pipeline in response to one or more of said second values and said clock signal, wherein said last stage of said pipeline is implemented within a column of a memory core.

16. The method according to claim 15, wherein said memory comprises a Static Random Access Memory (SRAM).

17. The method according to claim 15, wherein one or more of said intermediate stages comprise a plurality of memory latches.

18. The method according to claim 15, wherein said one or more second values comprise one or more wordline signals.

19. The apparatus according to claim 15, wherein said second signals comprise one or more of signals from the group consisting of column select signals, group select signals, and global wordline signals.

20. The method according to claim 15, wherein said first value comprises a memory address.

* * * * *